United States Patent [19]

Lambert et al.

[11] Patent Number: 4,820,376

[45] Date of Patent: Apr. 11, 1989

[54] FABRICATION OF CPI LAYERS

[75] Inventors: William R. Lambert, Mendham; Neng-Hsing Lu; Ray D. Rust, both of Berkeley Heights, all of N.J.

[73] Assignee: American Telephone and Telegraph Company AT&T Bell Laboratories, Murray Hill, N.J.

[21] Appl. No.: 116,988

[22] Filed: Nov. 5, 1987

[51] Int. Cl.[4] ............................................. H01R 43/00
[52] U.S. Cl. .................................... 156/643; 156/646; 156/656; 156/668; 439/66; 439/91; 439/591
[58] Field of Search .................. 439/66, 74, 86, 91, 439/591, 592, 908; 156/643, 646, 656, 655, 668

[56] References Cited

U.S. PATENT DOCUMENTS

| | | | |
|---|---|---|---|
| 3,541,222 | 11/1970 | Parks et al. | 439/66 X |
| 3,795,037 | 3/1974 | Luttmer | 439/591 X |
| 4,295,699 | 10/1981 | Durocher | 439/91 X |
| 4,408,814 | 10/1983 | Takashi et al. | 439/91 |
| 4,475,983 | 10/1984 | Bader et al. | 156/656 |
| 4,568,412 | 2/1986 | Atkins et al. | 156/655 |
| 4,599,137 | 7/1986 | Akiya | 156/643 |
| 4,615,763 | 10/1986 | Gelorme et al. | 156/643 |

*Primary Examiner*—David L. Lacey
*Assistant Examiner*—Andrew J. Anderson
*Attorney, Agent, or Firm*—Lester H. Birnbaum

[57] ABSTRACT

Disclosed is a method of fabricating conductive polymer interconnect (CPI) material which employs chains of electrically conductive particles within an elastomeric matrix. Contact resistance is improved by removing a thin layer is elastomeric material which remains after normal processing. The surface layer is removed by plasma etching so that the conductive particles protrude at both surfaces. The protruding particles can be plated to replace any conductive material removed by the etch.

9 Claims, 2 Drawing Sheets

FABRICATION OF CPI LAYERS

BACKGROUND OF THE INVENTION

This invention relates to the fabrication of conductive polymer material, also known as conductive polymer interconnect (CPI) material.

There is, at present, a great deal of interest in polymer material which is anisotropically electrically conductive. Such material can be employed, for example, in surface mounting of semiconductor components, in socket fixtures and in testing apparatus. One type of such material includes chains of conductive particles which are magnetically aligned in columns in an elastomeric matrix to provide the conduction in only the thickness (z) dimension of the resulting layer (See, for example, U.S. Patent Application of Jin et al, Ser. No. 936,998 filed on Dec. 4, 1986, now abandoned, assigned to the present assignee and incorporated by reference herein). Electrical connection is achieved upon compression of the elastomeric material between opposing contact areas. Due to the processing methods, the through resistance of the materials is not always at a desirably low level, e.g., less than 250 m$\Omega$, especially when the loads applied to the layer are small (e.g., less than 25 lbs.).

It is, therefore, an object of the invention to provide conductive polymer interconnect material with consistently low through resistance.

SUMMARY OF THE INVENTION

This and other objects are achieved in accordance with the invention which is a method of fabricating a layer of polymer material including chains of conducting particles extending essentially perpendicular to the major surfaces of the layer. The method comprises the step of removing a portion of at least one of said major surfaces by plasma etching so that the particles at the ends of said chains protrude through the etched surface.

BRIEF DESCRIPTION OF THE DRAWING

These and other features are delineated in detail in the following description. In the drawing.

DETAILED DESCRIPTION

Figure 1:
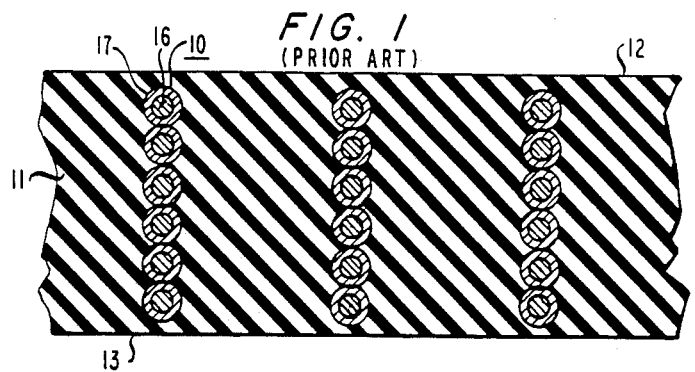
FIG. 1 is a cross-sectional schematic view of a polymer layer during one stage of fabrication in accordance with prior art techniques.

In accordance with a typical prior art technique for fabricating CPI, gold-or silver-plated nickel particles were mixed into a liquid silicone elastomer material which was spread onto a flat glass or plastic substrate. In the particular CPI material formulation analyzed, the particles had a diameter of approximately 100 $\mu$m, and the elastomer was a polymethylsiloxane room temperature vulcanizing (RTV) rubber such as that sold by General Electric under the designation GE 615/630 or by Dow Corning under the designation Silastic E RTV silicone. The material was then placed in a DC magnetic field within an oven so that the particles became aligned in chains extending essentially orthogonal to the major surfaces while the material was cured. The cured material was then removed from the substrate to give a layer having an appearance such as shown in FIG. 1 where a portion of the layer is schematically illustrated. It will be noted that the conductive particles, e.g., 10, comprising a nickel core 16, and gold coating 17, are aligned in chains within the polymer, 11, to produce conductive paths essentially orthogonal to the two major surfaces, 12 and 13, of the layer. While particles from some chains (approx. 10 percent) may protrude through the top surface, 12, there is a tendency for a thin layer of polymer to remain over the top particles in most chains. Further, since the bottom surface, 13, was covered by the substrate during alignment and cure, almost all the chains will be covered by a layer of polymer at that surface.

In accordance with a main feature of the invention, the surface layers are removed by a plasma etching process. A standard plasma etching chamber, such as that sold by Branson under the designation IPC 2000, was utilized with a gas mixture of $CF_4$ and $O_2$. The CPI layer was mounted vertically in the chamber to expose both surfaces. It is desirable to provide a high, uniform etch rate at a reliable power level, but without reaching a temperature on the surface of the layer which will degrade the properties of the elastomer material. For optimum results, therefore, it was discovered that the gas composition of $CF_4$ should be in the range of 72.5 percent to 75.5 percent, balance of $O_2$, with a flow rate within the range of 156-164 sccm. The optimum range for the power supplied to the chamber electrodes is 270-330 watts and the optimum pressure in the chamber is 400-500 millitorr. Values outside these ranges may be used. For example, it is expected that gas compositions with the concentration of $CF_4$ in the range 50-90 percent, remainder $O_2$, should be useful.

Etching was carried out for a period of 60 minutes in order to remove approximately a 20 $\mu$m thick layer from each surface of the material.

Figure 2:
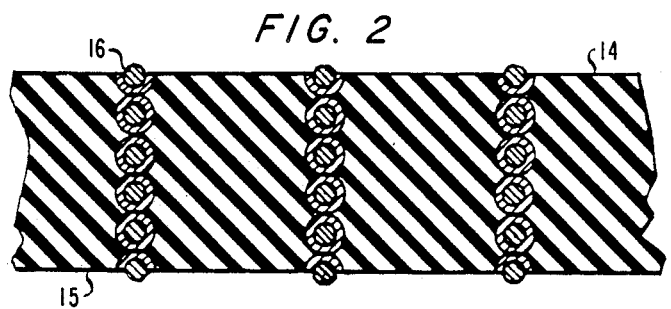
FIG. 2 is a cross-sectional schematic view of the layer during a later stage of fabrication in accordance with an embodiment of the invention.

FIG. 2 illustrates schematically the appearance of the material subsequent to the plasma etching operation. It will be noted that particles (e.g., 10) at the ends of the chains protrude through the etched surface layers, 14 and 15. The average end particle was exposed by an amount equal to approximately one-half of the particle diameter. As a further consequence of the etching, the gold plated portion of the particles, which is typically 1000-1500 angstroms, was also removed from the protruding particles, thus exposing the Ni cores (e.g., 16). It is desirable (but not necessary) to cover the exposed Ni to prevent formation of a nickel oxide which can increase through resistance.

Figure 3:
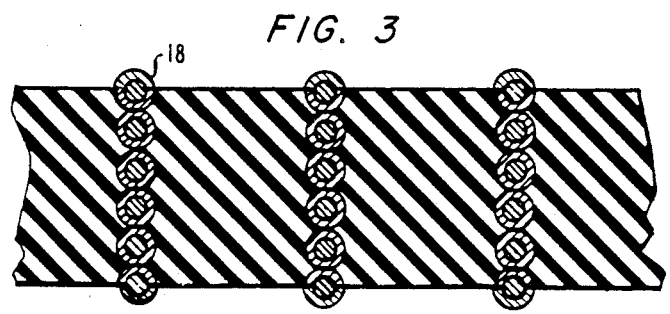
FIG. 3 is a cross-sectional schematic view of the layer during a still later stage of fabrication in accordance with the same embodiment.

Consequently, the material was inserted into an electroless gold plating solution to restore the noble metal surface. In this example, the solution was a commercially available, aqueous based, ammonium hydroxide plating solution which was sold by Shipley under the designation EL221. The material was dipped in the solution for approximately 5 minutes. The resulting material is illustrated in FIG. 3 where, it will be noted, a gold layer (e.g., 18) was selectively plated on the exposed nickel particles. The thickness of the gold layer was approximately 0.5 μm.

Figure 4:
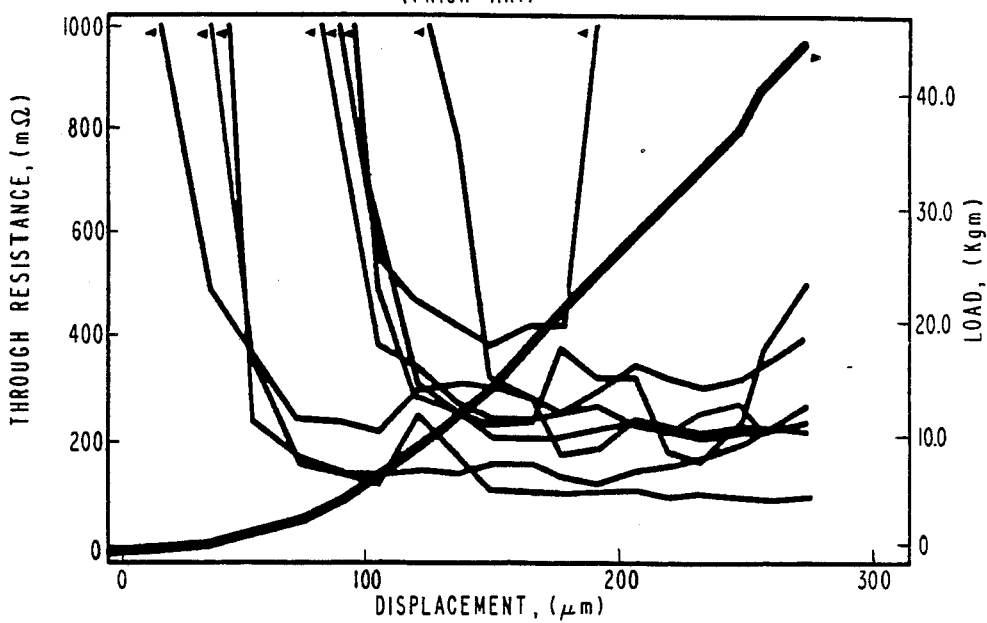
FIG. 4 is a graph of through resistance, displacement and load characteristics for a typical polymer layer during the stage of fabrication of FIG. 1.
Figure 5:
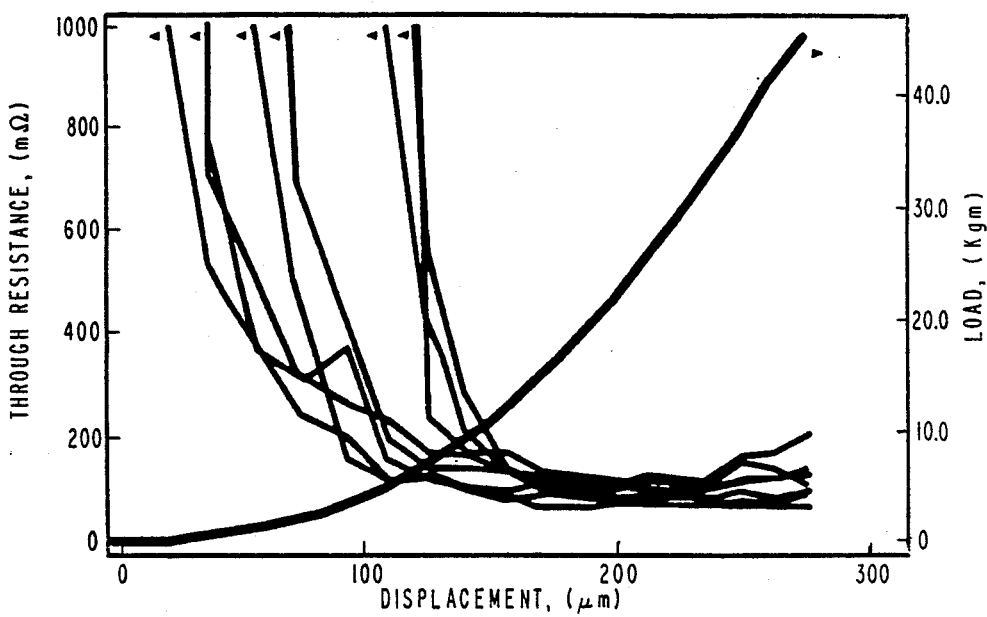
FIG. 5 is a graph of through resistance, displacement and load characteristics for a polymer layer after the stage of fabrication shown in FIG. 3.

The resulting materials were evaluated using a test fixture comprising two plates with 0.40 mm$^2$ area contact pads arranged in a 9 cm$^2$ area where the pads were separated by 127 mm. The layer was pressed between the plates, and simultaneous load, displacement and through resistance graphs were generated for eight test points dispersed through the pad array. FIGS. 4 and 5 show such data for an unetched and an etched layer, respectively. (The arrows on the graphs indicate the y-axis applicable to that graph). Each layer tested was approximately 1.3 mm thick and contained approximately 7.5 percent by volume of conductive particles which were 100 μm in diameter. It will be noted that the resistance of the unetched layer (FIG. 4) exhibits a wide dispersion of resistance even for higher loads, and includes an open circuit for one of the points tested. The etched layer (FIG. 5) shows a much narrower resistance distribution, which is maintained as the load and displacement are increased. Current carrying capacity also improved from approximately 0.25 amps for the unetched layer to approximately 0.50 amps for the etched material.

Although particles were exposed by approximately one-half a particle diameter, the particles were firmly retained in the elastomer even after repeated displacements of the material in an interconnection assembly (>500 cycles with loads up to 45 Kgm).

It was also predicted by calculations based on a Guassian distribution of resistances that the defect level (where a defect is defined as an interconnect with a resistance exceeding 1 ohm) decreased from greater than 1 in 10$^3$ interconnects for a typical unetched layer to 1 in 10$^6$ interconnects for an etched layer.

While the invention has been described with reference to a particular embodiment, it will be appreciated that several variations are possible. For example, any elastomeric material, especially other silicone elastomers, could benefit from the inventive method. Other types of conductive particles can also be employed. Other types of gas compositions, especially other fluorinated compounds, may also be useful in the plasma etching operation.

Various additional modifications will become apparent to those skilled in the art. All such variations which basically rely on the teachings through which the invention has advanced the art are properly considered within the scope of the invention.

What is claimed is:

1. A method of fabricating a layer of silicone elastomer material including chains of electrically conducting particles extending essentially perpendicular to the major surfaces of the layer, the method comprising the step of removing a portion of at least one of said major surfaces by plasma etching so that the particles at the ends of said chains protrude through the etched surface.

2. The method according to claim 1 further comprising the step of subjecting the layer to an electroless plating operation to restore any conducting material removed during the plasma etching operation.

3. The method according to claim 2 wherein the conducting particles comprise an inner conducting core and an outer conducting coating, and the plating operation restores the outer conducting coating of the protruding particles.

4. The method according to claim 3 wherein the inner core comprises nickel and the outer coating comprises a material selected from the group consisting of gold and silver.

5. The method according to claim 1 wherein the plasma etching employs a gas consisting essentially of $CF_4$ and $O_2$.

6. The method according to claim 5 wherein the gas composition is 72.5–75.5 percent $CF_4$ with the balance being $O_2$.

7. The method according to claim 6 wherein the flow rate of the gas is within the range 156–164 sccm.

8. The method according to claim 1 wherein the particles protrude an average distance of approximately one-half the particle diameter.

9. The method according to claim 1 wherein a surface portion of both major surfaces is removed by plasma etching.

* * * * *